(12) United States Patent
Ma

(10) Patent No.: US 6,651,704 B2
(45) Date of Patent: Nov. 25, 2003

(54) STATIONARY AND PIVOTABLE TRAYS FOR SEMICONDUCTOR WAFER TRANSFER

(75) Inventor: Yin-Cheng Ma, Taipei (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 162 days.

(21) Appl. No.: 09/996,179

(22) Filed: Nov. 19, 2001

(65) Prior Publication Data

US 2003/0094212 A1 May 22, 2003

(51) Int. Cl.⁷ .............................. B65B 1/04; B65B 3/04; B67C 3/04
(52) U.S. Cl. ............................ 141/86; 141/1; 141/98; 141/163; 414/935; 414/940
(58) Field of Search ............................. 141/1, 11, 69, 141/83, 85, 86, 87, 88, 98, 129, 163; 118/500; 414/935, 940, 941

(56) References Cited

U.S. PATENT DOCUMENTS

| | | | | |
|---|---|---|---|---|
| 5,301,700 A | * | 4/1994 | Kamikawa et al. | 134/76 |
| 5,478,195 A | * | 12/1995 | Usami | 414/805 |
| 5,628,121 A | * | 5/1997 | Brooks et al. | 34/61 |
| 5,740,845 A | * | 4/1998 | Bonora et al. | 141/292 |

* cited by examiner

Primary Examiner—Timothy L. Maust
(74) Attorney, Agent, or Firm—Tung & Associates

(57) ABSTRACT

Stationary and pivotable trays for semiconductor wafer transfer are disclosed. A first moving equipment is movable to move a container for holding one or more semiconductor wafers from a wafer loading and unloading position to a wafer tank immersion position. A second moving equipment is movable to move the container from the wafer loading and unloading position to a container loading and unloading position. A stationary tray is located under the wafer loading and unloading position to collect liquid dripping from the first moving equipment. A pivotable tray is located to one side of the stationary tray, to collect the liquid dripping from the first moving equipment when this equipment is moving to the wafer loading and unloading position, such that the pivotable tray is lowered. The pivotable tray is raised when the second moving equipment is moving to the wafer loading and unloading position.

20 Claims, 6 Drawing Sheets

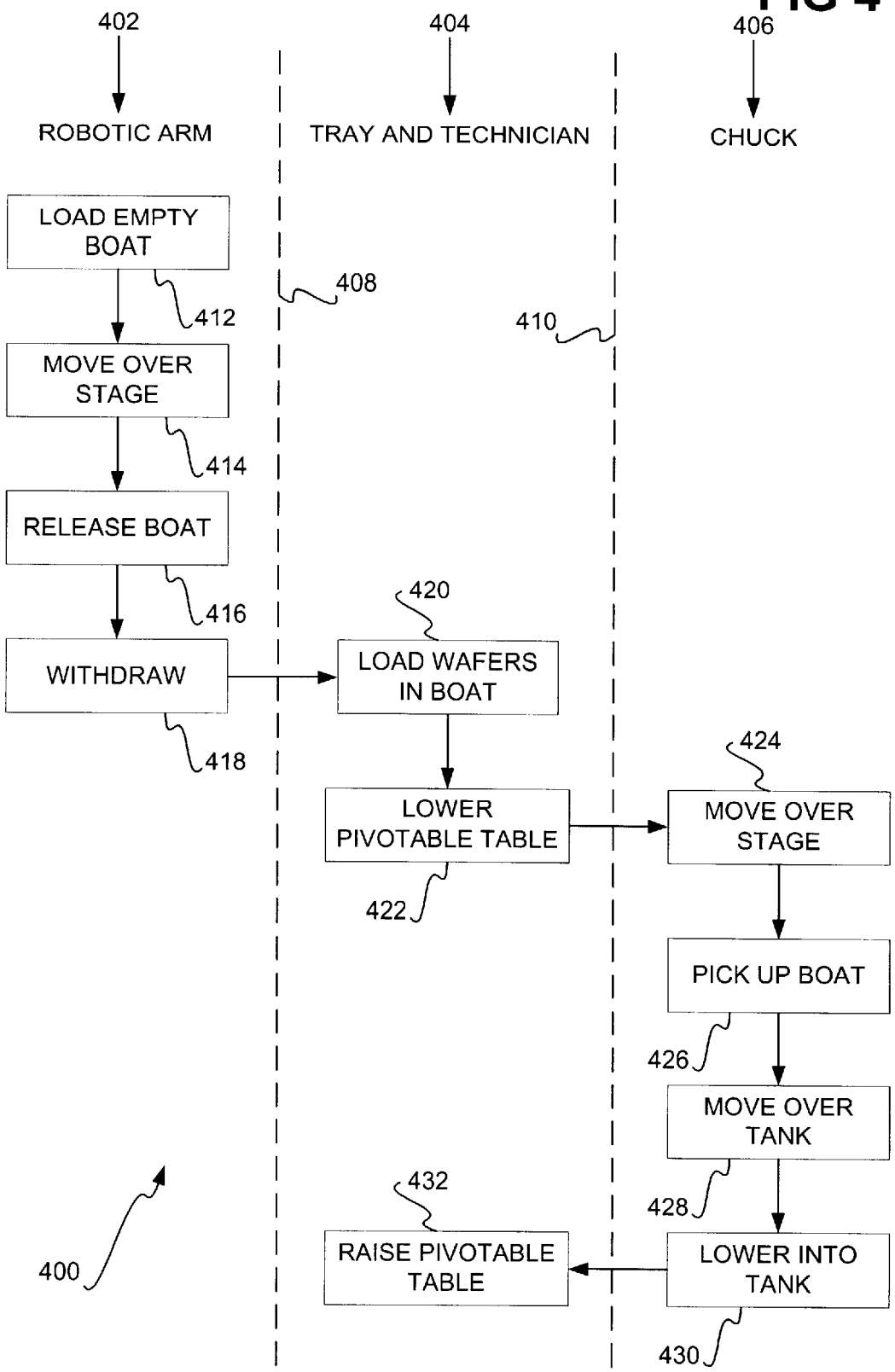

STATIONARY AND PIVOTABLE TRAYS FOR SEMICONDUCTOR WAFER TRANSFER

FIELD OF THE INVENTION

This invention relates generally to the transfer of semiconductor wafers among various semiconductor processing stations as well as other types of stations, and more particularly to collecting liquid dripping from moving equipment during such transfer.

BACKGROUND OF THE INVENTION

Semiconductor fabrication requires that a semiconductor wafer be processed in a variety of different manners. A wafer may be coated with photoresist, exposed to an ultraviolet light source to imprint a device pattern on the wafer, developed to remove the exposed photoresist, etched, and so on. Each different type of processing may require that the wafer be moved to a different processing station that is particular to a given type of processing. Therefore, the wafer must usually be transferred among different processing stations in order to fabricate devices on the wafer.

FIG. 1 shows an example system 100 in which wafer transfer is accomplished between a primary unit 102 and a secondary unit 104, as separated conceptually by a dotted line 106 and physically by a wall 110. A chuck 108 having arms 132 moves a container 128 horizontally between the primary unit 102 and the secondary unit 104. The chuck 108 may be such a chuck as manufactured by and available from Robotek International, of Richardson, Tex. The chuck container 128 is more specifically a boat or a cassette. The container 128 moves horizontally as indicated by the arrows 114 and 116. On the side of the primary unit 102, the chuck 108 may at least assist in submersing the container 128, and its contained semiconductor wafers, in an immersion tank 112, for a wet bench process. The chuck 108 may thus move the container 128 to the container position 131.

On the side of the secondary unit 104, a robotic arm 118 is able to move the container 128 vertically into and out of the plane of FIG. 1, as indicated by the in circle 120 and the out circle 122, once the container 128 has been deposited by the chuck 108 in the container position 130. The robotic arm 118 is able to accomplish its movement of the container 128 as a result of its arm 126. The arm 126, as well as the container position 130, is over a stage 124 of the secondary unit 104, as compared to the container position 131, which is over and/or in the tank 112 on the side of the primary unit 102. The robotic arm 118 may be such an arm as manufactured by and available from Kaijo Corp., of Tokyo, Japan. The robotic arm 118 is for moving from a container loading and unloading position, not shown in FIG. 1, to the container position 130, which is a wafer loading and unloading position. By comparison, the container position 131 is a wafer tank immersion position, such that the wafers can be immersed into the tank at this position. The position 131 may alternatively be located in the tank 112 as well.

A problem with the transfer of semiconductor wafers via the system 100 of FIG. 1 is that the caustic chemicals, or other liquid, in which the container 128 is immersed in the tank 112 may drip off chuck 108 when it is moving over the secondary unit 104. The caustic chemicals are those necessary for performing a wet bench operation on the semiconductor wafers held within the container 128. This can cause significant and rapid corrosion of the secondary unit 104, as well as the robotic arm 118 and its arm 128. The chuck 108 and the robotic arm 118 are more generally referred to as moving equipment, insofar as they move, or transfer, the container 128 and its contained semiconductor wafers.

A limited solution to this problem is to clean the chuck 108 before it is moved over the secondary unit 104. For instance, there may be a chuck-cleaning bath in which overflowing deionized water and/or blowing nitrogen clean the residual chemicals from the chuck 108. However, this is disadvantageous a at best. Chuck cleaning prolongs the transfer time from the primary unit 102 to the secondary unit 102, such as by nearly sixty seconds. This lowers the number of wafers that can be processed on a per hour basis, increasing cost to the semiconductor manufacturer. Furthermore, extra facility space is required to house the chuck cleaning bath, which may be expensive at best or not always available at worst. Finally, the cleaning bath cannot completely clean the chuck 108. Therefore, liquid dripping from the chuck 108 is only at best reduced, and thus at best only slows corrosion of the secondary unit 104.

Therefore, there is a need within the art to overcome these disadvantages. Specifically, there is a need to prevent the chuck 108 from corroding the secondary unit 104 and the robotic arm 118 when it is moving over the secondary unit 104. There is a need for complete prevention of such corrosion, and not just a decrease in the rate of corrosion. There is a need to prevent corrosion without slowing down the number of wafers that can be processed on an hourly basis, as well as without requiring extra space in the facility. For these and other reasons, there is a need for the present invention.

SUMMARY OF THE INVENTION

The invention relates to stationary and pivotable trays for semiconductor wafer transfer. A first moving equipment, such as a chuck, is movable to move a container for holding one or more semiconductor wafers from a wafer loading and unloading position to a wafer tank immersion position. A second moving equipment, such as a robotic arm, is movable to move the container from the wafer loading and unloading position to a container loading and unloading position. A stationary tray is located under the wafer loading and unloading position to collect liquid dripping from the first moving equipment. A pivotable tray is located to one side of the stationary tray, to collect the liquid dripping from the first moving equipment when this equipment is moving to the wafer loading and unloading position, such that the pivotable tray is lowered. The pivotable tray is raised when the second moving equipment is moving to the wafer loading and unloading position.

The invention provides for advantages over the prior art. The stationary and pivotable trays prevent the liquid dripping from the first moving equipment from corroding the second moving equipment, or other equipment, such as a secondary unit. The trays collect the dripping liquid, such that the first moving equipment does not have to be cleaned in a time-consuming bath, and such that the number of wafers that can be processed on an hourly basis is not decreased. Furthermore, the trays do not use potentially expensive facility space. Other advantages, embodiments, and aspects of the invention will become apparent by reading the detailed description that follows, and by referencing the attached drawings.

BRIEF DESCRIPTION OF THE DRAWINGS

FIG. 4 is a method according to an embodiment of the invention showing an example process in accordance with which the semiconductor wafer transfer system of FIGS. 2A, 2B, 3A, and 3B can be used.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
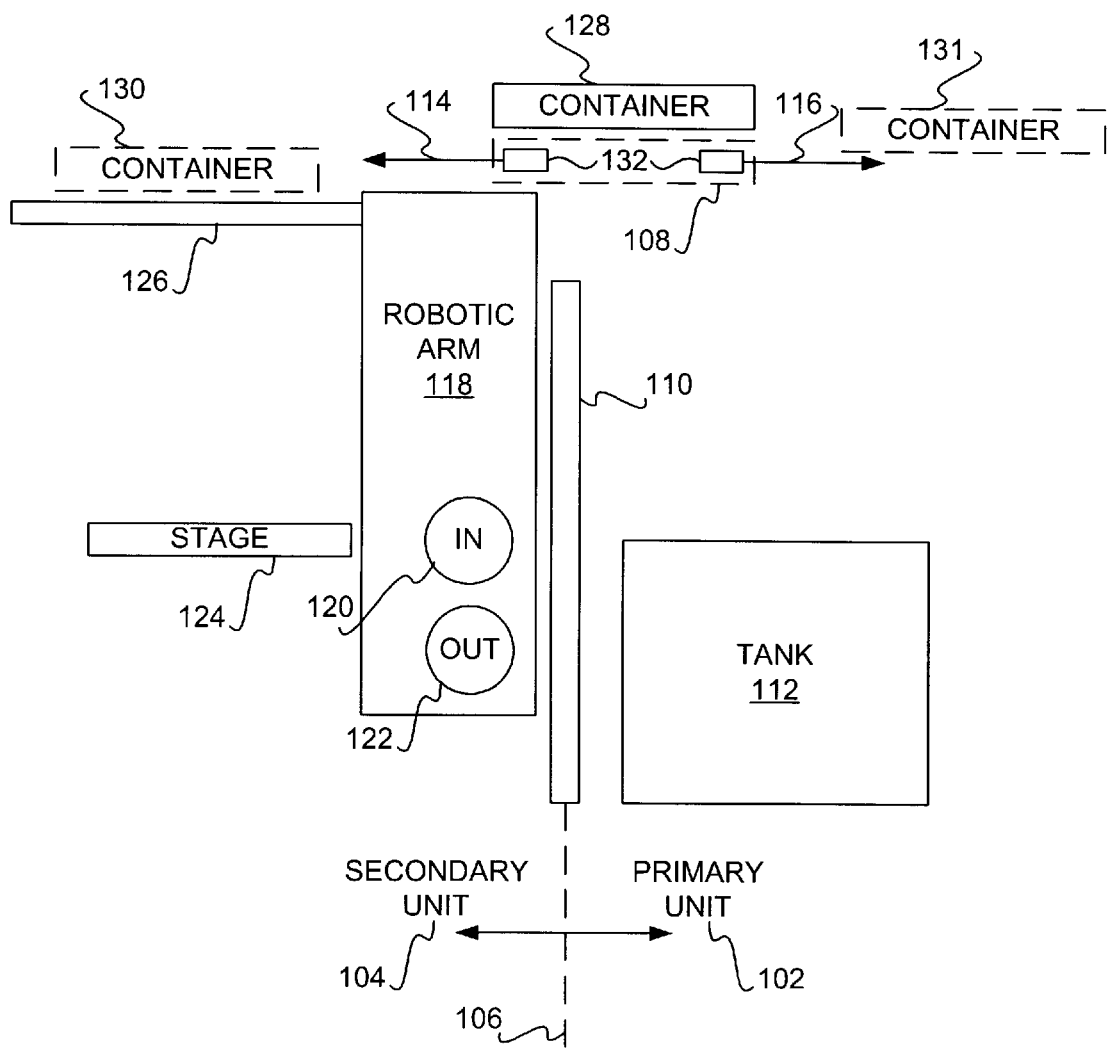
FIG. 1 is a diagram of a front view of a semiconductor wafer transfer system according to the prior art.
Figure 2A:
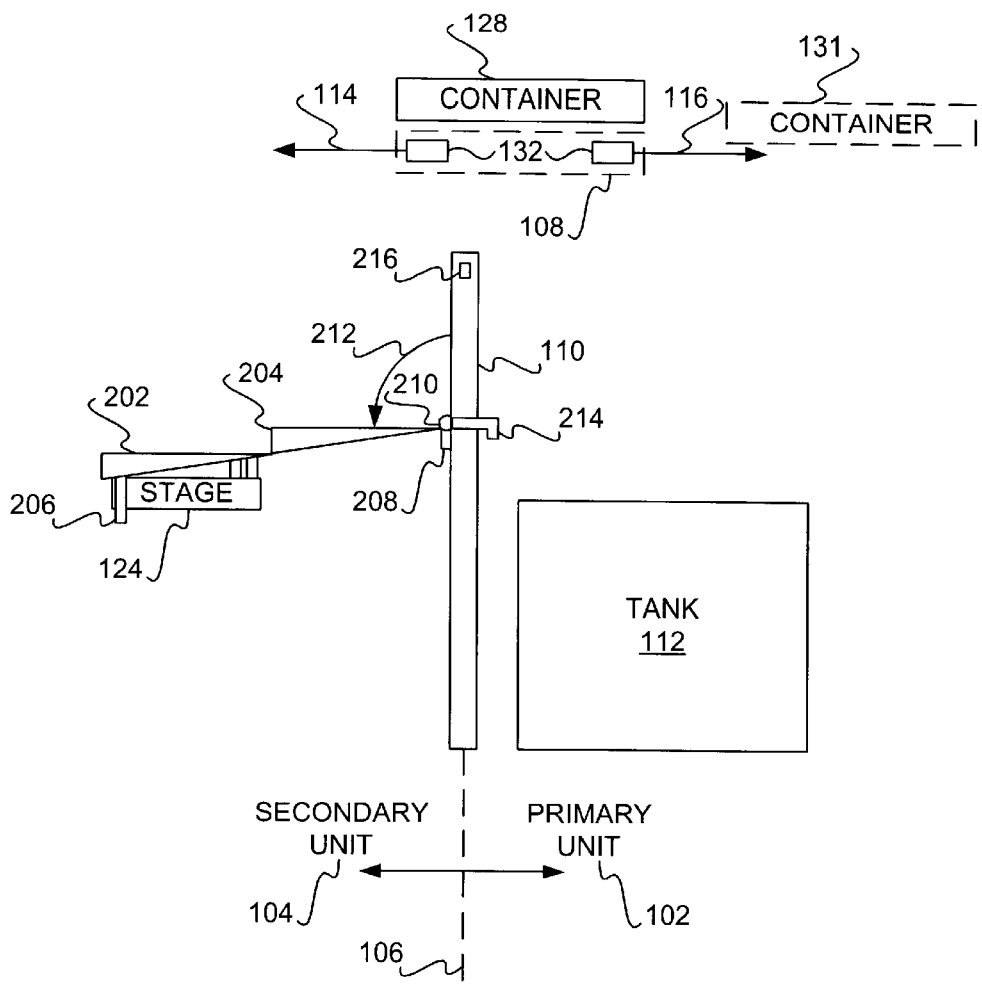
FIGS. 2A and 2B are diagrams of a front view and a top view, respectively, of a semiconductor wafer transfer system according to an embodiment of the invention, in which a pivotable tray thereof is in a lowered position.
Figure 2B:
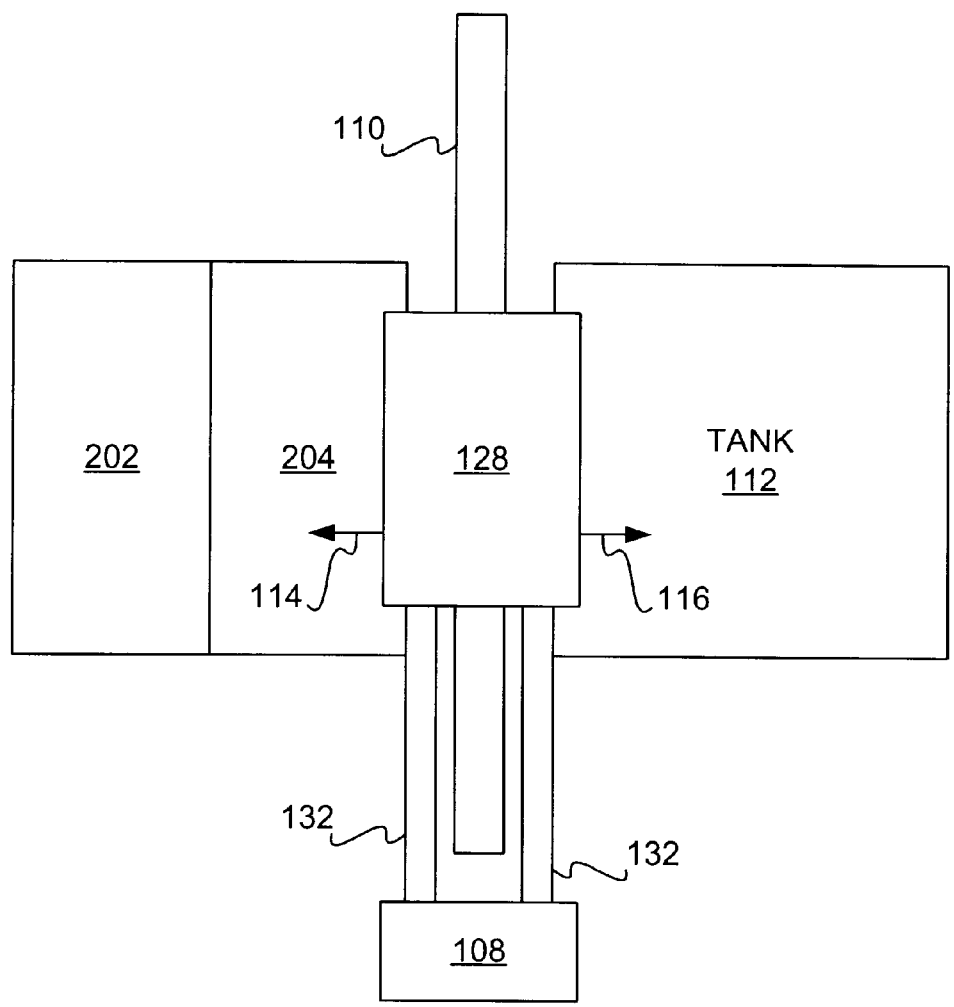

FIGS. 2A and 2B show a front view and a top view, respectively, of a semiconductor wafer transfer system 200 according to an embodiment of the invention. Wafer transfer is accomplished between a primary unit 102 and a secondary unit 104, as separated conceptually by a dotted line 106 and physically by a wall 110. A chuck 108 having arms 132 moves a container 128 horizontally between the primary unit 102 and the secondary unit 104. The chuck container 128 is more specifically a boat or a cassette. The container 128 moves horizontally as indicated by the arrows 114 and 116. On the side of the primary unit 102, the chuck 108 may at least assist in submersing the container 128, and its contained semiconductor wafers, in an immersion tank 112, for a wet bench process. The chuck 108 is more generally a piece of moving equipment. The container 128 can move to the position 131, which is referred to as a wafer tank immersion position, such that the wafers can be immersed into the tank at this position. The position 131 may alternatively be located in the tank 112 as well.

While the chuck 108 is moving over the side of the secondary unit 104, a pivotable tray 204 is in the lowered position, as shown in FIGS. 2A and 2B. The pivotable tray 204 pivots about a pivot mount, or point, 210, and is caused to pivot as shown by the arrow 212 by a motor 208. When the chuck 108 is moving over the pivotable tray 204, the tray 204 collects any liquid dripping from the chuck 108. A stationary tray 202, to which side the pivotable tray 204 is located, protects the stage 124 of the secondary unit 104 from the liquid dripping from the chuck 108, such that the stationary tray 202 collects this dripping liquid when the chuck 108 is so positioned thereover. A drain 206 on the stationary tray 202 drains the liquid collected by the stationary tray 202. Similarly, a drain 214 connected to the tray 204 drains the liquid collected by the pivotable tray 204, when the tray 204 is raised from its lowered position, or configuration, to its raised position, or configuration. A sensor 216 can be used to detect when the chuck 108 is moving to over the secondary unit 104, such that the tray 204 should be lowered.

Figure 3A:
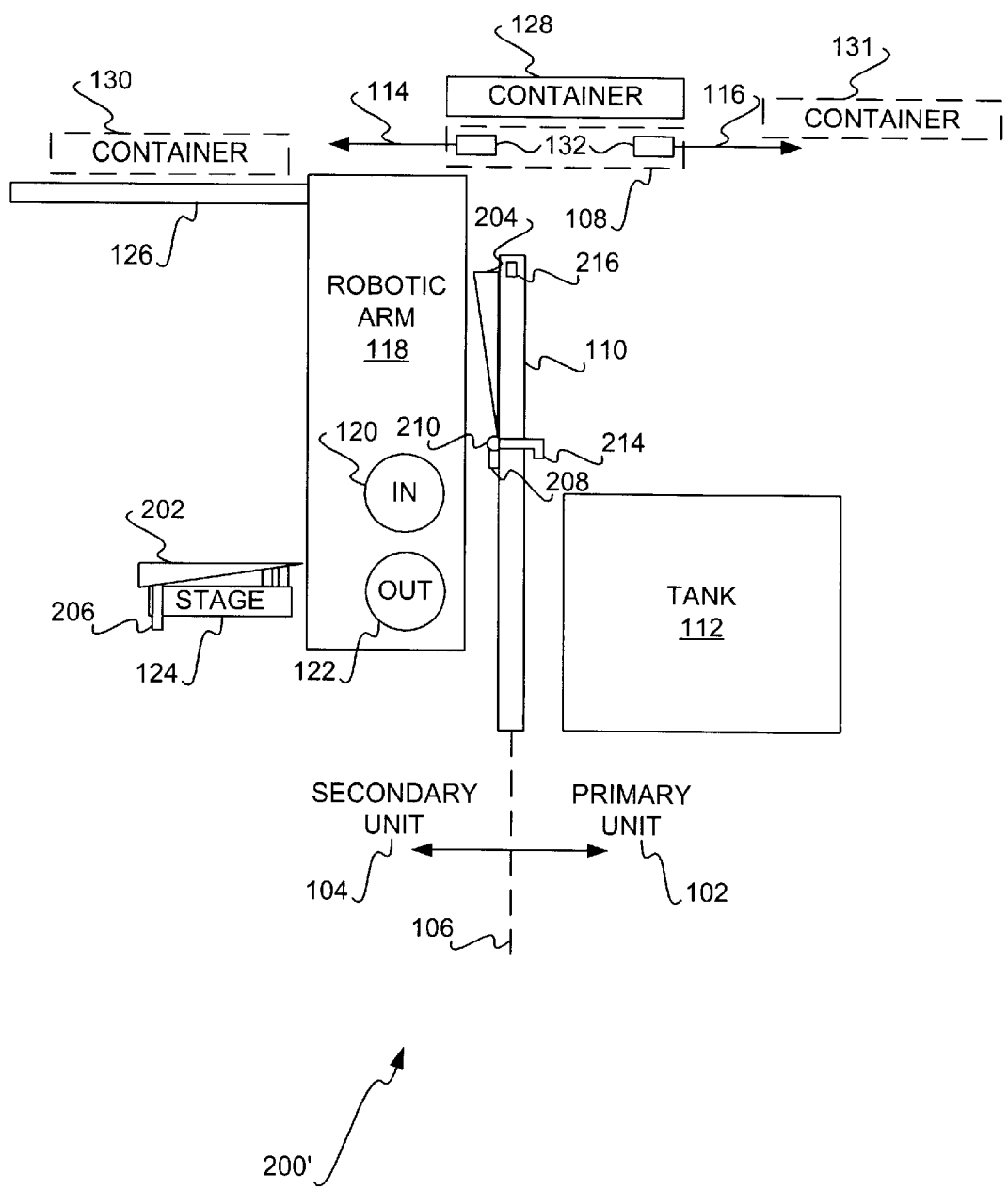
FIGS. 3A and 3B are diagrams of a front view and a top view, respectively, of the semiconductor wafer transfer system of FIGS. 2A and 2B, but in which the pivotable tray thereof is in a raised position.
Figure 3B:
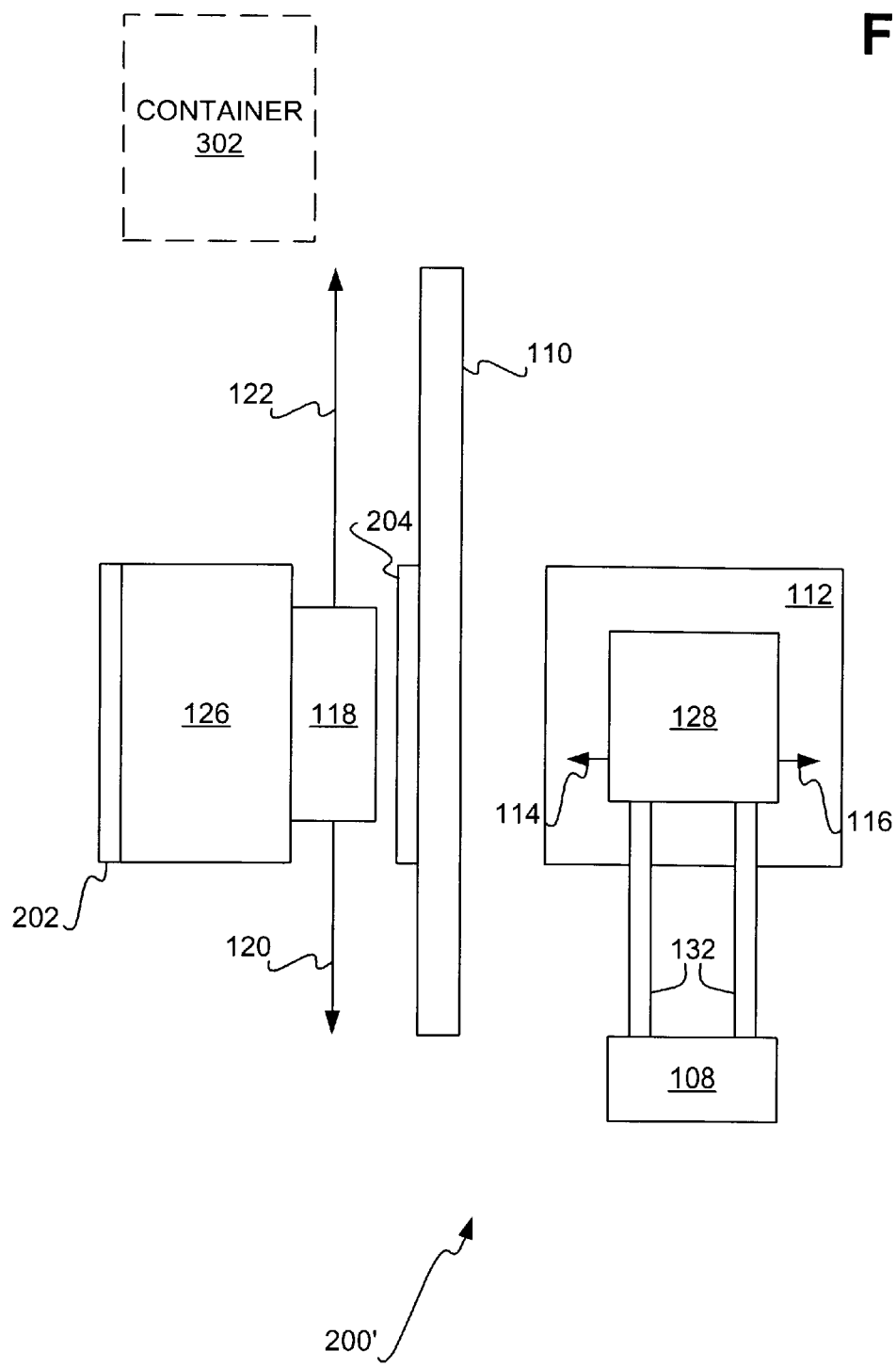

FIGS. 3A and 3B show a front view and a top view, respectively, of the wafer transfer system 200 when the pivotable tray 204 has been moved to its raised position, such that the system 200 is indicated as the system 200' in FIGS. 3A and 3B. Wafer transfer is accomplished in FIGS. 3A and 3B on the side of the secondary unit 104, from over the stage 124 to over the container position 302 of FIG. 3B, which is referred to as a boat loading and unloading position. Conversely, the container position 130 of FIG. 3A is referred to as a wafer loading and unloading position. The robotic arm 118 is able to move the container 128 vertically into and out of the plane of FIG. 3A, as indicated by the in circle 120 and the out circle 122. The robotic arm 118 is able to accomplish its movement of the container 128 as a result of its arm 126. The robotic arm 118, with its arm 126, is more generally a piece of moving equipment.

When the robotic arm 118 is moving to or from the container position 130, the pivotable tray 204 is in the raised position, as shown in FIG. 3A. This is because the pivotable tray 204 when lowered is in the path of the robotic arm 118, such that it is raised to not block the path. The tray 204 furthermore can be raised because the chuck 108 has already moved away from over the secondary unit 104, such that liquid dripping from the chuck 108 and onto the secondary unit 104 is no longer currently a concern. While the tray 204 is being raised, the liquid previously collected therein is drained via the drain 214, whereas the liquid that is collected in the tray 202 over the stage 124 of the secondary unit 104 is drained during liquid collection via the drain 206. The sensor 216 can be used to determine when the chuck 108 is no longer over the secondary unit 104, such that the pivotable tray 204 can be raised.

As shown in various of the FIGS. 2A, 2B, 3A, and 3B, there are three denoted positions in this embodiment of the invention for the container 128. In the position 302 of FIG. 3B, the container 128 can be loaded on and unloaded from the robotic 4 arm 118, specifically the arm 126 of the robotic arm 118. In the position 130 of FIG. 3A, the container 128 can have semiconductor wafers loaded thereon and loaded therefrom. Finally, in the position 131 of FIG. 2A, the container 128, and its contained semiconductor wafers, can be submersed into the tank 112, to perform a wet bench or other type of semiconductor processing operating. In addition, those of ordinary skill within the art can appreciate that other aspects, components, and parts of the semiconductor wafer transfer system described with reference to FIGS. 2A, 2B, 3A, and 3B may be present, and are not shown herein for purposes of illustrative clarity, and because they are not necessary to construction of aspects of the invention.

FIG. 4 shows an example method 400 that can be performed in accordance with the semiconductor wafer system that has been described. Various parts of the method 400 are performed by or at the robotic arm, the tray and the technician, and the chuck, as indicated by the columns 402, 404, and 406, as separated by the dotted lines 408 and 410. First, where the robotic arm is at the container loading and unloading position, which is more generally an inside position, an empty container, such as a boat or a cassette, may be loaded onto the arm (412). The robotic arm moves the container from this position to the wafer loading and unloading position over the stationary tray of the secondary equipment (414), where the container is released by the robotic arm (416). During movement, the pivotable tray is located in the raised position.

The technician then loads one or more semiconductor wafers into the container (420), and the pivotable tray is lowered (422) in preparation for the chuck moving over the secondary equipment to pick up the container, which now holds semiconductor wafers. The chuck thus moves over the stage to the wafer loading and unloading position (424), and picks up the container. The chuck then moves back to over the tank (428) to a wafer tank immersion position, also referred to more generally as an outside position. The container can then be lowered into the tank to submerse the wafers in the container in the liquid of the tank (430). Furthermore, once the chuck has moved past the secondary equipment, the pivotable tray can be raised (432).

It is noted that, although specific embodiments have been illustrated and described herein, it will be appreciated by those of ordinary skill in the art that any arrangement is calculated to achieve the same purpose may be substituted for the specific embodiments shown. For example, whereas the stationary and pivotable trays of the invention have been described in relation to a semiconductor wafer transfer scenario, the invention itself is not so particularly limited. This application is intended to cover any adaptations or variations of the present invention. Other applications and scenarios, besides that of semiconductor wafer transfer, are also amenable to the invention's stationary and pivotable trays. Therefore, it is manifestly intended that this invention be limited only by the claims and equivalents thereof.

What is claimed is:

1. An apparatus for transferring semiconductor wafers comprising:
    a first moving equipment movable to move a container for holding one or more semiconductor wafers from a wafer loading and unloading position to a wafer tank immersion position;
    a second moving equipment movable to move the container from the wafer loading and unloading position to a container loading and unloading position;
    a stationary tray located under the wafer loading and unloading position to collect liquid dripping from the first moving equipment; and
    a pivotable tray located to one side of the stationary tray to collect the liquid dripping from the first moving equipment when the first moving equipment is moving to the wafer loading and unloading position, such that the pivotable tray is lowered,
    the pivotable tray raised when the second moving equipment is moving to the wafer loading and unloading position.
2. The apparatus of claim 1, further comprising:
    a primary transfer unit, the wafer tank immersion position located at least one of in and over the primary transfer unit; and,
    a secondary transfer unit, the wafer loading and unloading position located over the secondary transfer unit.
3. The apparatus of claim 2, wherein the primary transfer unit comprises a tank into which the container is lowered by the first moving equipment.
4. The apparatus of claim 2, wherein the secondary transfer unit comprises a stage over which the stationary tray is located.
5. The apparatus of claim 1, further comprising:
    a first drain for the stationary tray to drain the liquid collected by the stationary tray; and
    a second drain for the pivotable tray to drain the liquid collected by the pivotable tray as the pivotable tray is raised.
6. The apparatus of claim 1, further comprising:
    a pivot point about which the pivotable tray pivots from a raised configuration to a lowered configuration, and from the lowered configuration to the raised configuration; and
    a motor to pivot the pivotable tray from the raised configuration to the lowered configuration, and from the lowered configuration to the raised configuration.
7. The apparatus of claim 1, further comprising a sensor to detect when the first moving equipment is moving to the wafer loading and unloading position and correspondingly cause the pivotable tray to be lowered.
8. The apparatus of claim 1, wherein the first moving equipment comprises a movable chuck.
9. The apparatus of claim 1, wherein the second moving equipment comprises a movable robotic arm.
10. The apparatus of claim 1, wherein the container comprises one of a boat and a cassette.
11. An apparatus comprising:
    a first moving equipment horizontally movable to move a container from a first position to a second position;
    a second moving equipment vertically movable to move the container from the second position to a third position;
    a stationary tray located under the second position; and
    a pivotable tray located to one side of the stationary tray in a path of the second moving equipment when the second moving equipment has moved the container to the second position,
    the pivotable tray lowered when the first moving equipment is moving the container from the first position to the second position, and raised when the second moving equipment is moving the container to the second position.
12. The apparatus of claim 11, further comprising a primary unit, the first position of the container located at least one of in and over the primary unit.
13. The apparatus of claim 11, further comprising a secondary unit, the second position of the container located over the secondary unit.
14. The apparatus of claim 11, further comprising a tank into which the container is lowered by the first moving equipment.
15. The apparatus of claim 11, wherein the first moving equipment comprises a movable chuck.
16. The apparatus of claim 11, wherein the second moving equipment comprises a movable robotic arm.
17. The apparatus of claim 11, wherein the container holds one or more semiconductor wafers.
18. The apparatus of claim 17, wherein the container comprises one of a boat and a cassette.
19. A method for transferring semiconductor wafers comprising:
    moving a container for holding one or more semiconductor wafers via a second moving equipment from an inside position to a wafer loading and unloading position over a stationary tray, such that a pivotable tray has been raised;
    releasing the container from the second moving equipment, the second moving equipment subsequently withdrawing;
    moving a first moving equipment to the wafer loading and unloading position over the stationary tray, such that the pivotable tray has been lowered;
    picking up the container by the first moving equipment, where one or more semiconductor wafers have already been loaded into the container; and
    moving the container via the first moving equipment from the wafer loading and unloading position to an outside position, the pivotable tray subsequently being raised.
20. The method of claim 19, the outside position comprising a wafer tank immersion position, the first moving equipment allow for the container to be lowered into a tank at the wafer tank immersion position, and the inside position comprising a container loading and unloading position at which the container is loaded onto the second moving equipment.

* * * * *